United States Patent
Doi

(10) Patent No.: US 9,726,205 B2
(45) Date of Patent: Aug. 8, 2017

(54) HYBRID CONSTRUCTION MACHINE

(71) Applicant: KOBELCO CONSTRUCTION MACHINERY CO., LTD., Hiroshima-shi (JP)

(72) Inventor: Takayuki Doi, Hiroshima (JP)

(73) Assignee: KOBELCO CONSTRUCTION MACHINERY CO., LTD., Hiroshima-shi (JP)

(*) Notice: Subject to any disclaimer, the term of this patent is extended or adjusted under 35 U.S.C. 154(b) by 181 days.

(21) Appl. No.: 14/825,585

(22) Filed: Aug. 13, 2015

(65) Prior Publication Data

US 2016/0061235 A1    Mar. 3, 2016

(30) Foreign Application Priority Data

Aug. 29, 2014   (JP) ................................. 2014-175063

(51) Int. Cl.
| | |
|---|---|
| F15B 21/08 | (2006.01) |
| H02J 7/00 | (2006.01) |
| E02F 9/20 | (2006.01) |
| G01R 31/36 | (2006.01) |

(52) U.S. Cl.
CPC ............ *F15B 21/08* (2013.01); *E02F 9/2075* (2013.01); *E02F 9/2091* (2013.01); *G01R 31/3679* (2013.01); *H02J 7/007* (2013.01); *H02J 7/0021* (2013.01)

(58) Field of Classification Search
CPC ............ F15B 21/08; G01R 31/36; H02J 7/00
USPC ............................................. 701/50; 320/107
See application file for complete search history.

(56) References Cited

U.S. PATENT DOCUMENTS

| | | | |
|---|---|---|---|
| 2013/0169232 A1 | 7/2013 | Middleton et al. | |
| 2013/0271065 A1* | 10/2013 | Chou | G01R 31/36 320/107 |
| 2013/0282241 A1 | 10/2013 | Sugiyama | |
| 2013/0300378 A1 | 11/2013 | Sugiyama | |
| 2015/0051855 A1* | 2/2015 | Joe | G01R 31/362 702/63 |
| 2016/0248362 A1* | 8/2016 | Baron | H02P 25/083 |

FOREIGN PATENT DOCUMENTS

| | | |
|---|---|---|
| JP | 2002-236156 A | 8/2002 |
| JP | 2010-041828 | 2/2010 |
| JP | 2011-64063 A | 3/2011 |
| JP | 2013-119761 | 6/2013 |

OTHER PUBLICATIONS

Extended European Search Report issued Apr. 13, 2016 in Patent Application No. 15181547.9.

* cited by examiner

*Primary Examiner* — Tan Q Nguyen
(74) *Attorney, Agent, or Firm* — Oblon, McClelland, Maier & Neustadt, L.L.P.

(57) ABSTRACT

A hybrid construction machine detects the voltage of each cell that forms a battery, calculates a difference voltage between the detected voltage and a predetermined upper-limit working voltage, selects the lower one of the calculated difference voltage and a stored difference voltage, corrects an upper-limit working charging rate to decrease as the selected difference voltage decreases, and controls charging of the battery, based on the corrected upper-limit working charging rate.

4 Claims, 8 Drawing Sheets

HYBRID CONSTRUCTION MACHINE

TECHNICAL FIELD

The present invention relates to a hybrid construction machine such as a hybrid shovel which is operated by the power of an engine and the power of a power storage device.

BACKGROUND ART

Description will be made of the background art by way of a hybrid shovel as an example.

In a hybrid shovel, from the perspective of protecting a power storage device, a charging rate that does not exceed an "upper-limit working voltage" of the power storage device even when supposed maximum regeneration energy (maximum regeneration energy) generated by a revolving operation or the like is absorbed is set in advance as an "upper-limit working charging rate". Moreover, the hybrid shovel controls the power storage device so that the upper limit of the charging rate of the power storage device is determined so as not to exceed the upper-limit working charging rate (see Japanese Unexamined Patent Publication No. 2010-41828).

The "power storage device" in the present specification includes both a secondary battery (a so-called "battery") such as a lithium-ion battery and a capacitor (an electric double-layer capacitor). However, for the sake of convenience, in the embodiment of the present invention, the power storage device will be referred to as a "battery".

Moreover, the "upper-limit working voltage" refers to a battery voltage (that is, an upper limit of a practical battery voltage) at which the hybrid shovel stops due to a battery abnormality if the voltage exceeds the upper-limit working voltage.

Here, when a battery deteriorates with use as well as aging, an internal resistance thereof increases and the battery voltage increases. Thus, an overvoltage state may occur.

On the other hand, it is technically difficult to detect a deterioration of a battery appearing as an increase in the internal resistance directly.

As a countermeasure to this problem, in the related art disclosed in Japanese Unexamined Patent Publication No. 2010-41828, an upper-limit working charging rate is set to a value in which a margin corresponding to a certain deterioration amount is taken into account by predicting a future deterioration. That is, in Japanese Unexamined Patent Publication No. 2010-41828, the upper-limit working charging rate is set to such a low value that the battery voltage does not exceed an upper-limit working voltage when regeneration energy is absorbed even if the battery deteriorates.

However, the deterioration progresses with use, and for example, the degree of deterioration of the battery is different depending on whether the battery is a new product or has been used for a long period. However, in Japanese Unexamined Patent Publication No. 2010-41828, the upper-limit working charging rate is set to a low value by taking a margin corresponding to a certain deterioration amount into account regardless of the degree of deterioration of the battery and is not updated. Due to this, the upper-limit working charging rate of a new battery is too low to provide an original battery performance. That is, since the upper-limit working charging rate is lower than an upper-limit working charging rate that is to be set originally, the remaining capacity of the battery is not used sufficiently. Further, the upper-limit working charging rate of a battery used for a long period is too large that an overvoltage state in which the battery voltage exceeds the upper-limit working voltage may occur during absorption of regeneration energy.

On the other hand, Japanese Unexamined Patent Publication No. 2013-119761 discloses a technique of detecting an accumulated operating time of a machine or a battery voltage serving as an indicator of the degree of progress of a battery deterioration and specifying a correction value corresponding to the detected accumulated operating time of the machine or the detected battery voltage from a correction value map to thereby correct an upper-limit working charging rate using the specified correction value.

However, the accumulated operating time and the battery voltage are merely indicators of deterioration (that is, roughly estimated signs) and do not always indicate the degree of deterioration directly.

Moreover, the state of progress of battery deterioration is not constant but is different depending on the use condition (for example, a temperature environment), the use frequency, and the like.

Thus, in the related art disclosed in Japanese Unexamined Patent Publication No. 2013-119761, it is impossible to detect the degree of deterioration of a battery exactly and perform precise charging control by reflecting the degree of deterioration.

SUMMARY OF INVENTION

Therefore, an object of the present invention is to provide a hybrid construction machine capable of detecting the degree of deterioration of a power storage device accurately and perform precise charging control by reflecting the degree of deterioration.

A hybrid construction machine according to an aspect of the present invention is a hybrid construction machine including:

a hydraulic pump that serves as a hydraulic power source of a hydraulic actuator;

a generator motor;

an engine that is connected to the hydraulic pump and the generator motor;

a power storage device;

a generator motor controller that assists the engine by a motor action of the generator motor with the aid of power of the power storage device;

a control unit that controls charging and discharging of the power storage device; and a battery monitoring device that detects a voltage of the power storage device, wherein the control unit includes:

a difference voltage calculating unit that calculates a difference voltage, which is a difference between an upper-limit working voltage that is set in advance as an upper limit of a usable voltage of the power storage device, and the voltage of the power storage device detected by the battery monitoring device;

a storage unit that stores the difference voltage;

an updating unit that updates the storage unit by selecting the lower one of the calculated difference voltage and the stored difference voltage stored in the storage unit;

a correcting unit that corrects an upper-limit working charging rate, which is set in advance as an upper limit of a charging rate usable for the power storage device, to decrease as the selected difference voltage decreases; and a charging/discharging control unit that controls charging of the power storage device, based on the corrected upper-limit working charging rate.

According to this configuration, it is possible to detect the degree of deterioration of a power storage device accurately and perform precise charging control by reflecting the degree of deterioration.

DESCRIPTION OF EMBODIMENTS

The invention is now described, by way of example, with reference to the accompanying drawings.

Hereinafter, a case in which a hybrid construction machine according to an embodiment of the present invention is applied to a hybrid shovel will be described by way of example.

Figure 8:
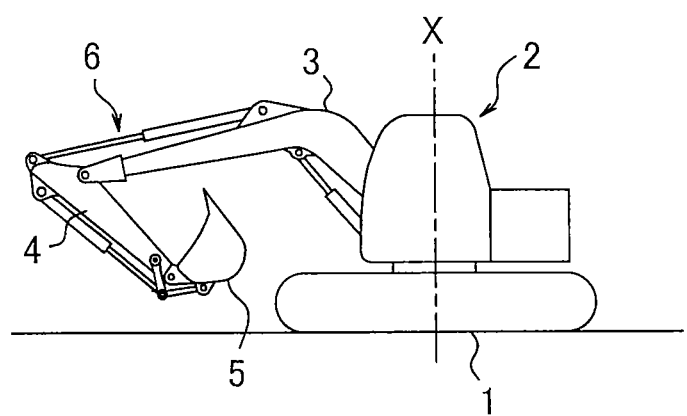
FIG. 8 is a schematic side view of a hybrid shovel to which the present invention is applied.

As illustrated in FIG. 8, a hybrid shovel includes a lower traveling body 1 and an upper revolving body 2 mounted on the lower traveling body 1 so as to freely revolve about an axis X that is vertical to the ground. A working attachment 6 including a boom 3, an arm 4, and a bucket 5 is attached to the upper revolving body 2.

Moreover, in the hybrid shovel, a hydraulic pump and a generator motor are connected to an engine serving as a power source. A hydraulic actuator is driven by the hydraulic pump and a power storage device is charged by the generator action of the generator motor. With the power of the power storage device, the generator motor operates as a motor and assists the engine at an appropriate time.

Figure 1:
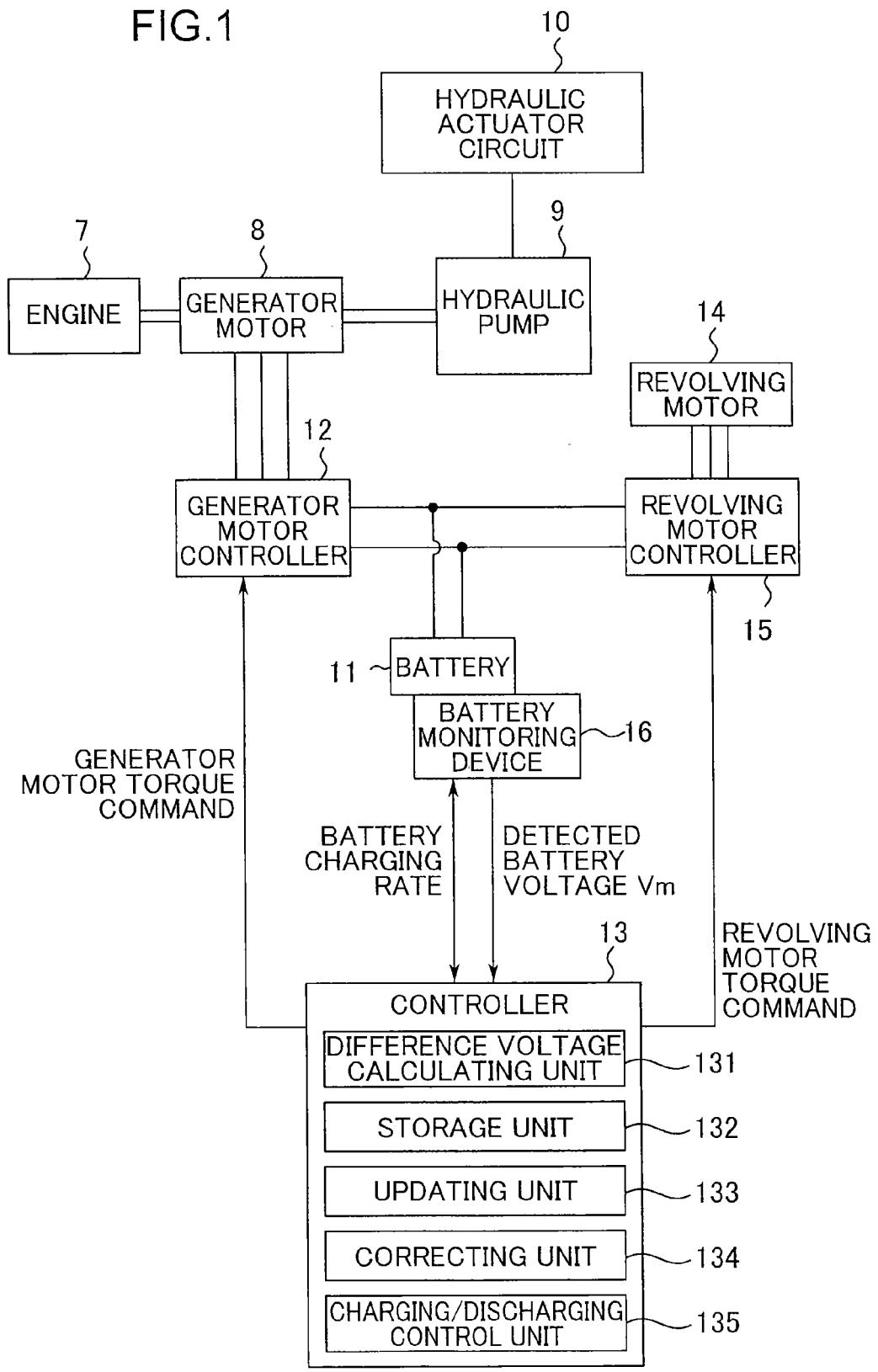
FIG. 1 is a diagram illustrating a system configuration when a hybrid construction machine according to an embodiment is applied to a hybrid shovel.

FIG. 1 is a diagram illustrating a system configuration when a hybrid construction machine according to an embodiment is applied to a hybrid shovel.

As illustrated in FIG. 1, the hybrid shovel includes an engine 7, a generator motor 8, a hydraulic pump 9, a hydraulic actuator circuit 10, a battery 11, a generator motor controller 12, a controller 13 (an example of a control unit), a revolving motor 14, a revolving motor controller 15, and a battery monitoring device 16.

In such a hybrid shovel as illustrated in the drawing, the hydraulic pump 9 and the generator motor 8 that performs generator and motor actions are mechanically connected to the engine 7 serving as a power source. The generator motor 8 and the hydraulic pump 9 are driven by the engine 7. In FIG. 1, the hydraulic pump 9 is connected with the generator motor 8 interposed.

Hydraulic actuator circuits 10 (only one is illustrated for simplicity of the drawing) corresponding to respective hydraulic actuators are connected to the hydraulic pump 9. A hydraulic actuator (not illustrated) is driven by the pressurized oil from the hydraulic pump 9.

The power storage device (battery) 11 is connected to the generator motor 8 with the generator motor controller 12 interposed. The generator motor controller 12 controls charging and discharging of the battery 11 as a basic operation under the control of the controller 13 serving as a control unit. Moreover, the generator motor controller 12 controls, for example, switching between the generator action and the motor action of the generator motor 8.

That is, during operation of the hybrid shovel, when a charging rate of the battery 11 decreases to a predetermined level or lower, the generator motor controller 12 causes the generator motor 8 to operate as a generator. Moreover, the generator motor controller 12 charges the battery 11 with the power generated by the generator motor 8 that operates as a generator. On the other hand, when the charging rate of the battery 11 is higher than the predetermined level, the generator motor controller 12 causes the generator motor 8 to operate as a motor. Moreover, the generator motor controller 12 drives the generator motor 8 with the power stored in the battery 11 to cause the generator motor 8 to assist the engine 7.

The generator motor controller 12 receives a generator motor torque command corresponding to an operation of an operating lever (not illustrated) from the controller 13 and controls the operation of the generator motor 8 based on the received generator motor torque command.

Moreover, the revolving motor 14 serving as a revolving driving source is provided in the hybrid shovel. The revolving motor 14 is driven with the power of the battery 11. Due to this, the upper revolving body 2 illustrated in FIG. 8 revolves and the battery 11 is charged with regeneration power generated in the revolving motor 14 when the revolving decelerates.

The revolving motor 14 is connected to the battery 11 with the revolving motor controller 15 interposed. The revolving motor controller 15 receives a revolving motor torque command corresponding to an operation of a revolving operating lever (not illustrated) from the controller 13 and controls the operation of the revolving motor 14 based on the received revolving motor torque command.

Moreover, the battery monitoring device 16 that detects a voltage (the voltage of each cell) and a charging rate (SOC: State of Charge) of the battery 11 is provided in the hybrid shovel. The battery monitoring device 16 provides to the controller 13 inputs of the detected voltage Vm and the detected charging rate.

The controller 13 corrects an upper-limit working charging rate according to the degree of progress of deterioration of the battery 11 and controls the charging of the battery 11 based on the corrected upper-limit working charging rate.

The charging control will be described in detail. The controller 13 includes a processor such as an application specific integrated circuit (ASIC), a field-programmable gate array (FPGA), or a CPU, a ROM, a RAM, and a rewritable storage device such as an EEPROM, for example.

Figure 2:
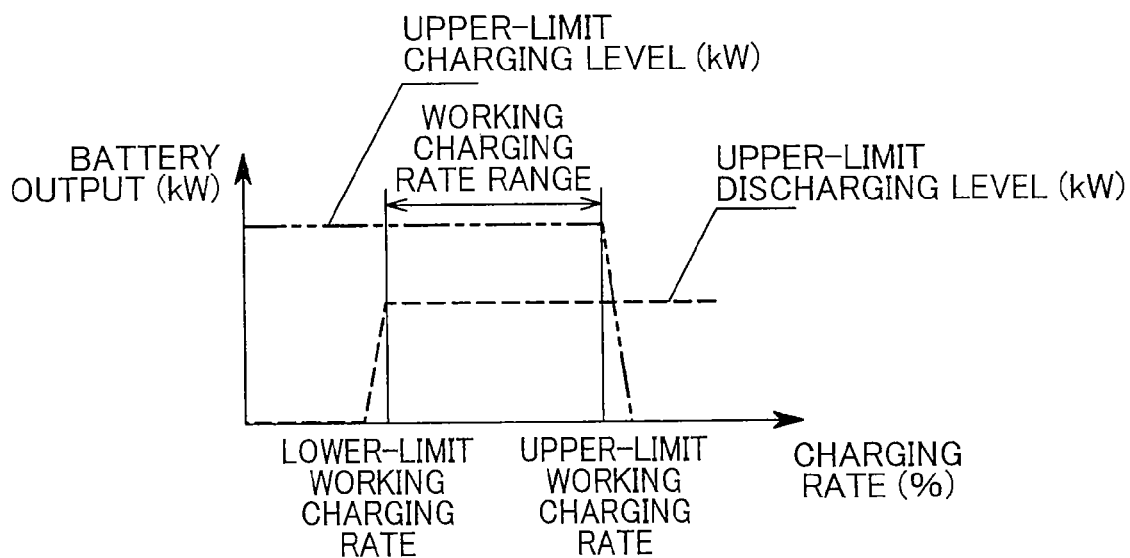
FIG. 2 is a graph illustrating a "working charging rate range" that is set in advance as the range of charging rates usable for a new (non-deteriorated) battery.

FIG. 2 is a graph illustrating a "working charging rate range" that is set in advance as the range of charging rates usable for the new (non-deteriorated) battery 11. In FIG. 2, the vertical axis represents a battery output (unit: kW) and the horizontal axis represents the charging rate of the battery 11. The battery output indicates the power output by the battery 11. The "working charging rate range" is the range of charging rates between "lower-limit working charging rate" and "upper-limit working charging rate".

The "lower-limit working charging rate" is the lower limit of the practically usable charging rate of the battery 11. The battery 11 is controlled so that the charging rate during discharging is higher than the "lower-limit working charging rate".

The "upper-limit working charging rate" is the upper limit of the practically usable charging rate of the battery 11 and has a value lower than 100%, for example. The battery 11 is controlled so that the charging rate during charging does not exceed the "upper-limit working charging rate".

An "upper-limit charging level" indicates a maximum power that the battery 11 can apply during charging and has a value corresponding to the charging rate. An "upper-limit discharging level" indicates a maximum power that the battery 11 can output during discharging and has a value corresponding to the charging rate.

In the example of FIG. 2, the "upper-limit charging level" is set to a constant value in the region equal to or lower than the "upper-limit working charging rate" and is set to "0" after decreasing abruptly in the region higher than the "upper-limit working charging rate". Due to this, the charging rate of the battery 11 is substantially prevented from exceeding the "upper-limit working charging rate," and the battery 11 can absorb the regeneration energy of the generator motor 8 and the revolving motor 14 during regeneration.

Moreover, the "upper-limit discharging level" is set to a constant value in the region higher than the "lower-limit working charging rate" and is set to "0" after decreasing abruptly in the region equal to or lower than the "lower-limit working charging rate". Due to this, the charging rate of the battery 11 is substantially prevented from becoming equal to or lower than the "lower-limit working charging rate," and the battery 11 is prevented from becoming unable to drive the generator motor 8 and the revolving motor 14. The "upper-limit charging level" is higher than the "upper-limit discharging level".

When the battery 11 deteriorates with use, since the internal resistance of the battery 11 increases, the deterioration of the battery 11 appears as an increase in the voltage (battery voltage) of the battery 11.

Thus, with the progress of the deterioration of the battery 11, a difference (difference voltage $\Delta V = Vu - Vm$) between the upper limit (the upper-limit working voltage Vu) of the usable battery voltage and the detected battery voltage Vm decreases. As a result, the possibility that an overvoltage state in which the detected voltage Vm exceeds the upper-limit working voltage Vu occurs during regeneration increases.

In the present embodiment, the controller 13 includes the following constituent elements.

The controller 13 includes a difference voltage calculating unit 131, a storage unit 132, an updating unit 133, a correcting unit 134, and a charging/discharging control unit 135.

The difference voltage calculating unit 131 calculates a difference voltage $\Delta V$ between the upper-limit working voltage Vu and the detected voltage Vm of the battery 11 detected by the battery monitoring device 16.

The storage unit 132 stores the difference voltage $\Delta V$.

The updating unit 133 updates the storage unit 132 by selecting the lower one of the calculated difference voltage $\Delta V$ and the stored difference voltage $\Delta V$ stored in the storage unit 132. Here, the lower-one selection means selecting the smaller difference voltage $\Delta V$ among the calculated difference voltage $\Delta V$ and the stored difference voltage $\Delta V$. Moreover, the stored value means the difference voltage $\Delta V$ selected as the lower one among the values calculated by that time.

Figure 3:
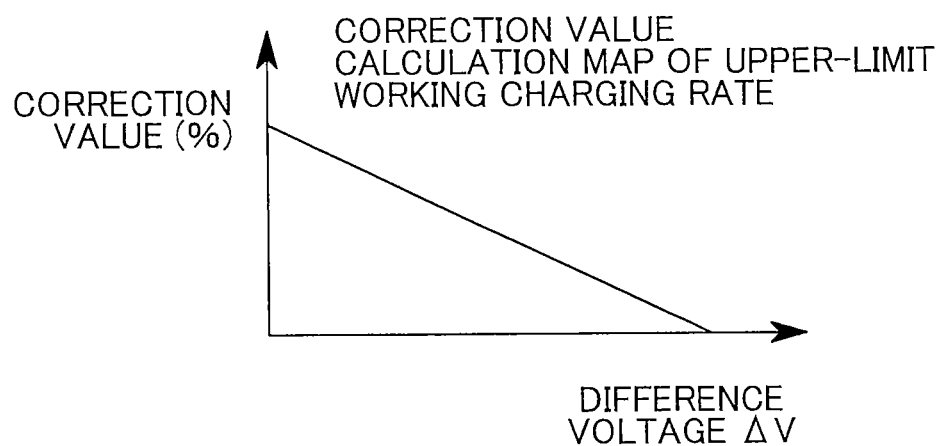
FIG. 3 is a graph schematically illustrating a correction value calculation map used in the embodiment.

The correcting unit 134 calculates a correction value corresponding to the selected difference voltage $\Delta V$ by referring to a correction value calculation map illustrated in FIG. 3 in which a relation between the difference voltage $\Delta V$ and the "correction value" is determined in advance.

FIG. 3 is a graph schematically illustrating the correction value calculation map, in which the vertical axis represents the correction value (unit: %) of the "upper-limit working charging rate" and the horizontal axis represents the difference voltage $\Delta V$. As illustrated in FIG. 3, the correction value calculation map defines the difference voltage $\Delta V$ and the correction value so that the larger the difference voltage $\Delta V$, the smaller the correction value. In the example of FIG. 3, the correction value calculation map is created so that the correction value decreases at a predetermined constant slope as the difference voltage $\Delta V$ increases.

Figure 4:
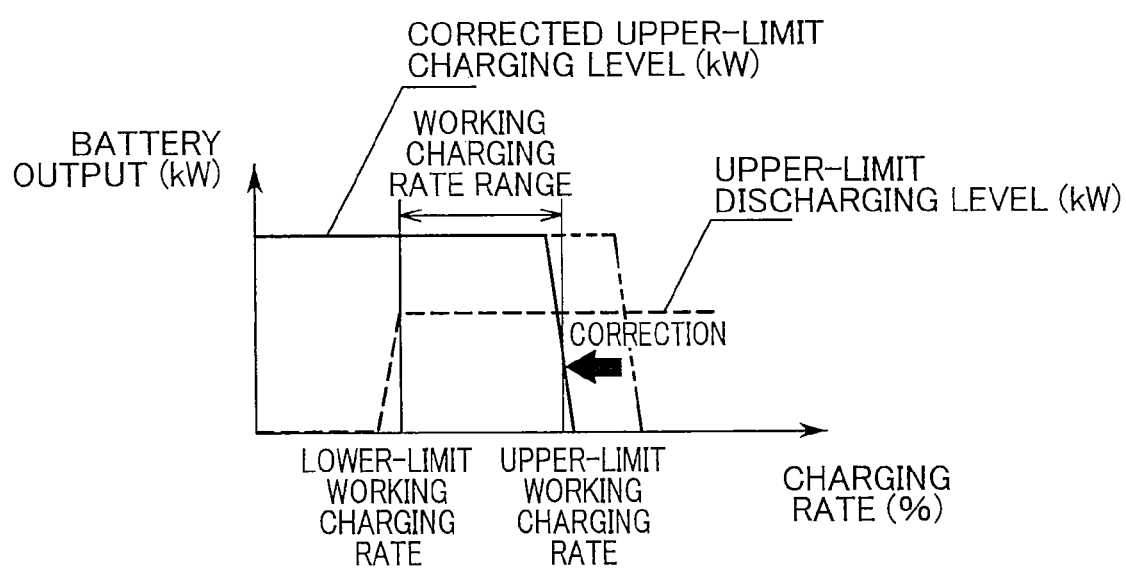
FIG. 4 is a graph illustrating a corrected "working charging rate range"

As illustrated in FIG. 4, the correcting unit 134 corrects the "upper-limit working charging rate" so as to decrease as the difference voltage $\Delta V$ decreases. In the example of FIG. 3, when the battery 11 is a new product, the correction value is set to 100%, for example. Moreover, the correction value is set such that the correction value decreases at a constant inclination from 100% as the difference voltage $\Delta V$ increases. Thus, the correcting unit 134 may correct the upper-limit working charging rate by multiplying the initial "upper-limit working charging rate" by the correction value.

The charging/discharging control unit 135 determines the "upper-limit charging level" of the battery 11 so as not to exceed the corrected "upper-limit working charging rate". Specifically, during regeneration, the charging/discharging control unit 135 determines the "upper-limit charging level" corresponding to the present charging rate of the battery 11 detected by the battery monitoring device 16 using the "corrected upper-limit charging level" illustrated in FIG. 4. Moreover, the controller 13 may control the generator motor controller 12 and the revolving motor controller 15 so that the battery voltage does not exceed the determined "upper-limit charging level".

Figure 5:
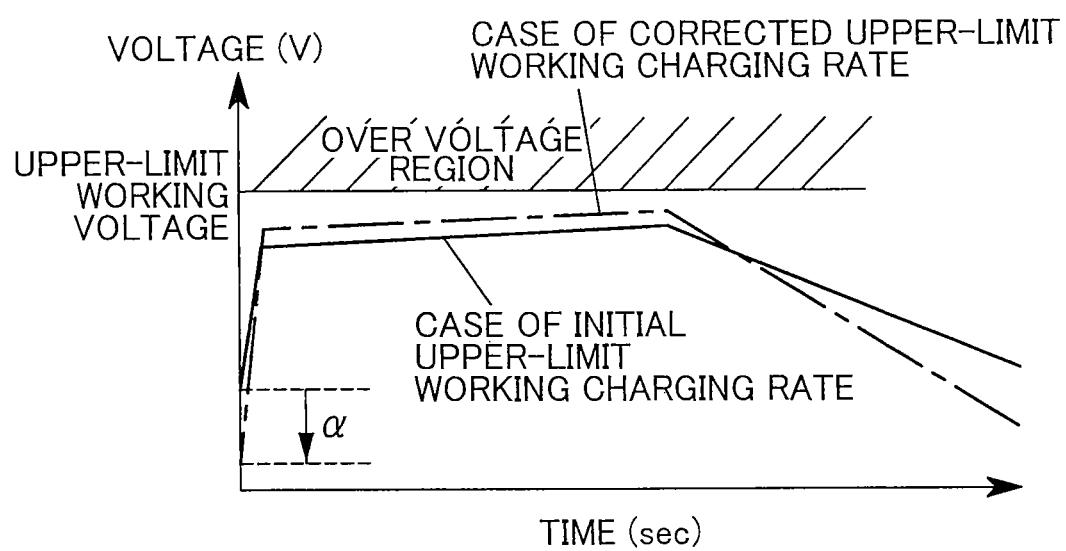
FIG. 5 is a graph illustrating the behavior of a battery voltage during regeneration.

The result of this control is illustrated in FIG. 5.

FIG. 5 is a graph illustrating the behavior of the battery voltage during regeneration. In the drawing, the graph of "initial upper-limit working charging rate" indicated by a solid line illustrates the behavior of the battery voltage of a new battery in which no correction is applied, corresponding to FIG. 2. In FIG. 5, the vertical axis represents a voltage and the horizontal axis represent time.

The graph of "corrected upper-limit working charging rate" indicated by a one-dot-chain line illustrates the behavior of the battery voltage in which correction is applied with a battery deterioration, corresponding to FIG. 4.

As illustrated in the drawing, the hybrid shovel of the present embodiment applies correction even after the battery deterioration progresses to suppress the battery voltage during regeneration to be equal to or lower than the upper-limit working voltage Vu. In this way, it is possible to prevent the occurrence of an overvoltage state.

That is, in the hybrid shovel of the present embodiment, since the "upper-limit working charging rate" is corrected so as to decrease as the difference voltage $\Delta V$ decreases, the battery voltage at the start of regeneration is lower than the battery voltage before correction by the voltage $\alpha$. Due to this, during regeneration, the battery voltage is prevented from exceeding the upper-limit working voltage Vu. As a result, it is possible to prevent the battery voltage from entering an overvoltage region.

The operations will be described based on flowcharts.

Figure 6:
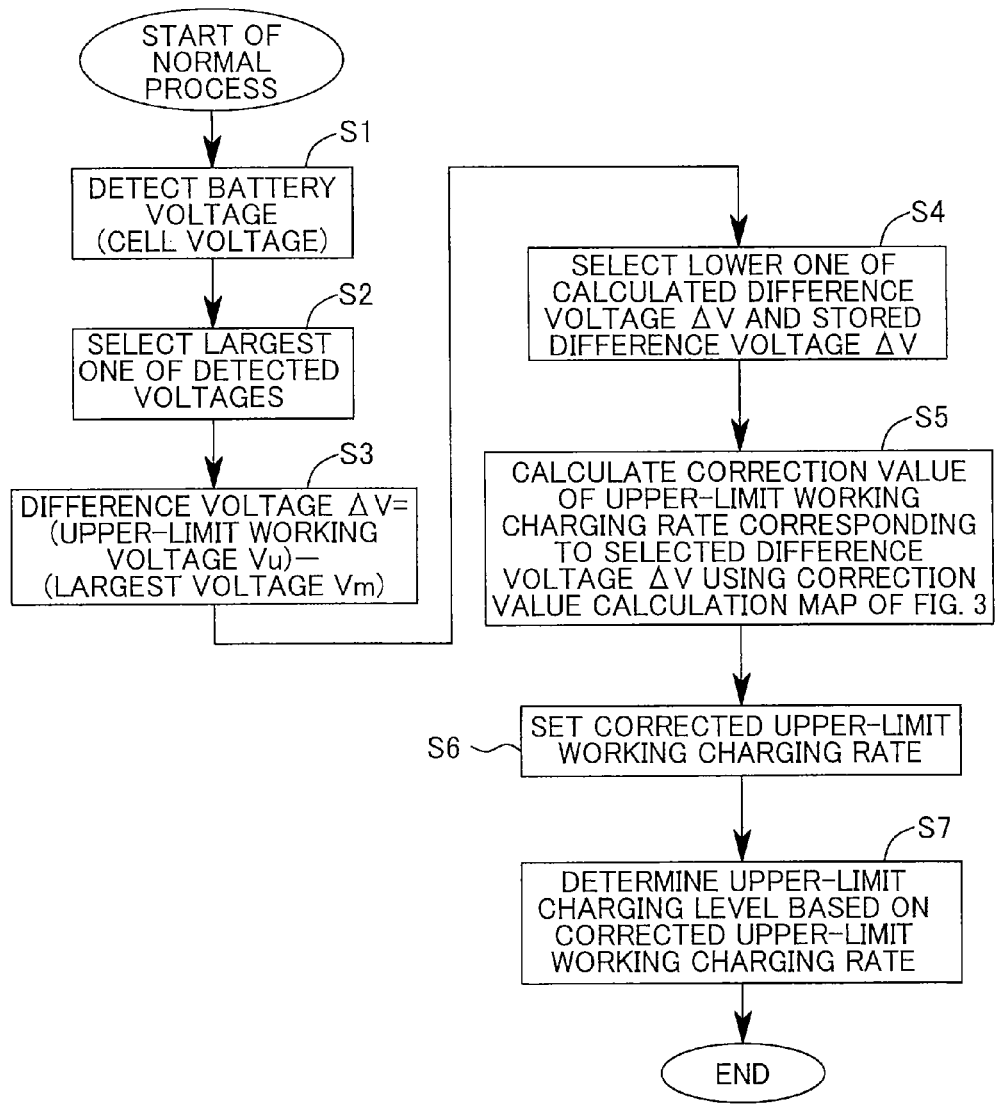
FIG. 6 is a flowchart for describing a normal process routine according to the embodiment.
Figure 7:
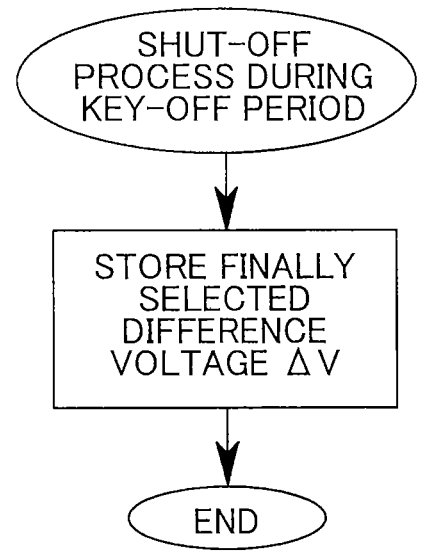
FIG. 7 is a flowchart for describing the content of a shut-off process according to the embodiment.

FIG. 6 is a flowchart illustrating a normal process routine and FIG. 7 is a flowchart illustrating a shut-off process routine during a key-off period.

As a normal process, in step S1 of FIG. 6, the battery monitoring device 16 detects a battery voltage. Here, the battery monitoring device 16 detects a battery voltage (cell voltage) of each cell.

In step S2, the difference voltage calculating unit 131 selects the largest value of the detected cell voltages. In step S3, the difference voltage calculating unit 131 calculates a difference voltage $\Delta V$ between the largest cell voltage and the upper-limit working voltage Vu.

Subsequently, in step S4, the updating unit 133 selects the lower one of the calculated difference voltage $\Delta V$ and the stored difference voltage $\Delta V$. In step S5, the correcting unit 134 calculates the correction value of the upper-limit working charging rate corresponding to the selected difference voltage $\Delta V$ using the correction value calculation map (FIG. 3). In step S6, the charging/discharging control unit 135 sets the corrected upper-limit working charging rate. In step S7, the charging/discharging control unit 135 determines the upper-limit charging level based on the corrected upper-limit working charging rate and ends the process. The flowchart of FIG. 6 is executed periodically when the key of the hybrid shovel is on, for example.

On the other hand, the shut-off process illustrated in FIG. 7 is executed during a key-off period in which the key of the hybrid shovel is off. In the shut-off process, the updating unit 133 stores the finally selected difference voltage $\Delta V$ in the storage unit 132.

In this manner, the hybrid shovel of the present embodiment selects the lower one of the calculated difference voltage $\Delta V$ and the stored difference voltage $\Delta V$ and corrects the upper-limit working charging rate based on the selected difference voltage $\Delta V$. That is, the hybrid shovel of the present embodiment corrects the upper-limit working charging rate based on the latest deterioration information. Due to this, the hybrid shovel of the present embodiment can perform precise charging control by reflecting the degree of progress of deterioration accurately.

That is, it is possible to prevent the battery 11 from entering an overvoltage state (unusable state) and to obviate the possibility that the machine stops abnormally.

In this case, the battery voltage is monitored in respective cells that form the battery 11, the difference voltage $\Delta V$ is calculated using the largest cell voltage, and the lower one of the calculated difference voltage $\Delta V$ and the stored difference voltage $\Delta V$ is selected. Thus, it is possible to perform charging control more precisely by taking a variation in the degrees of deterioration between cells into account.

The present invention can be applied to other hybrid construction machines without being limited to the hybrid shovel.

In the flowchart of FIG. 6, although the difference voltage is calculated using the largest cell voltage, the difference voltage may be calculated using the voltage of the entire battery 11. When the difference voltage $\Delta V$ is calculated using the largest cell voltage, the upper-limit working voltage may have a value corresponding to one cell. Moreover, when the difference voltage is calculated using the voltage of the battery 11, the upper-limit working voltage may have a value corresponding to the voltage of the battery 11.

Conclusion of Embodiment

A hybrid construction machine according to the embodiment includes:

a hydraulic pump that serves as a hydraulic power source of a hydraulic actuator;

a generator motor;

an engine that is connected to the hydraulic pump and the generator motor;

a power storage device;

a generator motor controller that assists the engine by a motor action of the generator motor with the aid of power of the power storage device;

a control unit that controls charging and discharging of the power storage device; and a battery monitoring device that detects a voltage of the power storage device, wherein the control unit includes:

a difference voltage calculating unit that calculates a difference voltage, which is a difference between an upper-limit working voltage that is set in advance as an upper limit of a usable voltage of the power storage device, and the voltage of the power storage device detected by the battery monitoring device;

a storage unit that stores the difference voltage;

an updating unit that updates the storage unit by selecting the lower one of the calculated difference voltage and the stored difference voltage stored in the storage unit;

a correcting unit that corrects an upper-limit working charging rate, which is set in advance as an upper limit of a charging rate usable for the power storage device, to decrease as the selected difference voltage decreases; and a charging/discharging control unit that controls charging of the power storage device, based on the corrected upper-limit working charging rate.

Here, the difference voltage between the upper-limit working voltage of the power storage device and the detected voltage of the power storage device indicates the degree of deterioration of the power storage device. In this configuration, since the lower one of the calculated difference voltage and the stored difference voltage is selected, it is possible to understand the state of progress of the deterioration of the power storage device accurately.

Moreover, in this configuration, since the upper-limit working charging rate is corrected based on the selected difference voltage (that is, the latest deterioration information), it is possible to perform precise charging control by reflecting the degree of progress of deterioration accurately.

Thus, in this configuration, it is possible to prevent the power storage device from entering an overvoltage state (unusable state) and to obviate the possibility that the hybrid construction machine stops abnormally.

In the hybrid construction machine, the power storage device may include a plurality of cells, the battery monitoring device may detect the voltage of each of the cells, and the difference voltage calculating unit may calculate the difference voltage, using a largest voltage among voltages detected by the battery monitoring device.

Since the internal resistance indicating the deterioration of respective cells varies from cell to cell, when an overvoltage state due to a deterioration occurs in a certain cell, the hybrid construction machine may stop due to a voltage abnormality, and the entire power storage device may become unusable.

Thus, the difference voltage calculating unit selects the largest one of the voltages detected in respective cells that form the power storage device and calculates the difference voltage using the largest value.

The voltage is monitored in respective cells in this manner, the difference voltage is calculated using the largest cell voltage, and the lower one of the difference voltages is selected. Thus, it is possible to perform charging control more precisely by taking a variation in the degrees of deterioration between cells into account.

In the hybrid construction machine, the correcting unit may determine a correction value corresponding to the selected difference voltage, using a correction value calculation map in which a relation between the difference voltage and the correction value is predetermined, so that the correction value of the upper-limit working charging rate decreases as the difference voltage increases, and the correcting unit may correct the upper-limit working charging rate, using the determined correction value.

According to this configuration, the correction value corresponding to the difference voltage is determined using the correction value calculation map in which the relation between the difference voltage and the correction value is set in advance, and the upper-limit working charging rate is corrected using the determined correction value. Due to this, it is possible to calculate the correction value accurately and quickly.

The hybrid construction machine may further include:
a revolving body;
a revolving motor that revolves the revolving body; and
a revolving motor controller that causes the revolving motor to operates as a motor with the aid of the power of the power storage device and causes the power storage device to be charged with a generator action of the revolving motor.

According to this configuration, in the hybrid construction machine having the revolving motor, it is possible to perform precise charging control by reflecting the degree of progress of deterioration accurately.

This application is based on Japanese Patent application No. 2014-175063 filed in Japan Patent Office on Aug. 29, 2014, the contents of which are hereby incorporated by reference.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

The invention claimed is:

1. A hybrid construction machine comprising:
a hydraulic pump that serves as a hydraulic power source of a hydraulic actuator;
a generator motor;
an engine that is connected to the hydraulic pump and the generator motor;
a power storage device;
a generator motor controller that assists the engine by a motor action of the generator motor with the aid of power of the power storage device;
a control unit that controls charging and discharging of the power storage device; and
a battery monitoring device that detects a voltage of the power storage device, wherein
the control unit includes:
a difference voltage calculating unit that calculates a difference voltage, which is a difference between an upper-limit working voltage that is set in advance as an upper limit of a usable voltage of the power storage device, and the voltage of the power storage device detected by the battery monitoring device;
a storage unit that stores the difference voltage;
an updating unit that updates the difference voltage which stored by the storage unit by selecting the lower one of the calculated difference voltage and the stored difference voltage stored in the storage unit;
a correcting unit that corrects an upper-limit working charging rate, which is set in advance as an upper limit of a charging rate usable for the power storage device, to decrease as the selected difference voltage decreases; and
a charging/discharging control unit that controls charging of the power storage device, based on the corrected upper-limit working charging rate.

2. The hybrid construction machine according to claim 1, wherein
the power storage device includes a plurality of cells,
the battery monitoring device detects the voltage of each of the cells, and
the difference voltage calculating unit calculates the difference voltage, using a largest voltage among voltages detected by the battery monitoring device.

3. The hybrid construction machine according to claim 1, wherein
the correcting unit determines a correction value corresponding to the selected difference voltage, using a correction value calculation map in which a relation between the difference voltage and the correction value is predetermined, so that the correction value of the upper-limit working charging rate decreases as the difference voltage increases, and
the correcting unit corrects the upper-limit working charging rate, using the determined correction value.

4. The hybrid construction machine according to claim 1, further comprising:
a revolving body;
a revolving motor that revolves the revolving body; and
a revolving motor controller that causes the revolving motor to operate as a motor with the aid of the power of the power storage device and causes the power storage device to be charged with a generator action of the revolving motor.

* * * * *